(12) United States Patent
Liu et al.

(10) Patent No.: US 9,674,949 B1
(45) Date of Patent: Jun. 6, 2017

(54) METHOD OF MAKING STRETCHABLE INTERCONNECT USING MAGNET WIRES

(71) Applicant: FLEXTRONICS AP, LLC, Broomfield, CO (US)

(72) Inventors: Weifeng Liu, Dublin, CA (US); Zhen Feng, San Jose, CA (US); Anwar Mohammed, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 51 days.

(21) Appl. No.: 14/266,700

(22) Filed: Apr. 30, 2014

Related U.S. Application Data (63) Continuation-in-part of application No. 14/145,815, filed on Dec. 31, 2013.

(60) Provisional application No. 61/870,646, filed on Aug. 27, 2013, provisional application No. 61/870,627, filed on Aug. 27, 2013, provisional application No. 61/913,830, filed on Dec. 9, 2013.

(51) Int. Cl.
*H05K 1/02* (2006.01)
*H05K 1/09* (2006.01)
*H05K 1/11* (2006.01)

(52) U.S. Cl.
CPC ........... *H05K 1/0283* (2013.01); *H05K 1/028* (2013.01); *H05K 1/09* (2013.01); *H05K 1/118* (2013.01); *H05K 1/11* (2013.01); *H05K 2201/0137* (2013.01); *H05K 2201/0162* (2013.01); *H05K 2201/032* (2013.01); *H05K 2201/05* (2013.01)

(58) Field of Classification Search
CPC .......... H05K 1/09; H05K 1/11; H05K 1/0283; H05K 2201/05; H05K 2201/032; H05K 2201/0137; H05K 2201/0162; H05K 1/028; H05K 1/118; H05K 1/0393; H01L 23/467; H01L 23/4006; H01L 23/4093
See application file for complete search history.

(56) References Cited

U.S. PATENT DOCUMENTS

| | | |
|---|---|---|
| 3,471,348 A | 10/1969 | Iles |
| 3,951,493 A | 4/1976 | Kozel |
| 4,733,383 A | 3/1988 | Waterbury |
| 4,931,021 A | 6/1990 | Mohan |
| 4,956,524 A | 9/1990 | Karkow |

(Continued)

OTHER PUBLICATIONS

Final Office Action mailed on Oct. 17, 2016, U.S. Appl. No. 14/712,842, filed May 14, 2015, Applicant: Joan K. Vrtis, 27 pages.

*Primary Examiner* — Ishwarbhai B Patel
*Assistant Examiner* — Paresh Paghadal
(74) *Attorney, Agent, or Firm* — Haverstock & Owens LLP (57) ABSTRACT

A stretchable wire assembly includes a metal wire coupled between two elastic substrates. The two elastic substrates are selectively coupled together, and the metal wire is attached to one or both elastic substrates at select locations. The form of the metal wire is such that when the elastic substrates are in a relaxed, or non-stretched, state the metal wire forms a tortuous path, such as a waveform, along the coupled elastic substrates. The tortuous path of the metal wire provides slack such that as the elastic substrates are stretched the slack is taken up. Once released, the elastic substrates move from the stretched position to the relaxed, non-stretched position, and slack is reintroduced into the metal wire in the form of the original tortuous path.

13 Claims, 6 Drawing Sheets

(56) References Cited

U.S. PATENT DOCUMENTS

| | | |
|---|---|---|
| 4,981,172 A | 1/1991 | Haerle |
| 5,121,297 A | 6/1992 | Haas |
| 5,184,827 A | 2/1993 | Suttle |
| 5,259,833 A | 11/1993 | Barnett |
| 5,445,869 A | 8/1995 | Ishikawa |
| 5,555,915 A | 9/1996 | Kanao |
| 5,764,498 A | 6/1998 | Sundstrom |
| 5,777,275 A | 7/1998 | Mizutani et al. |
| 5,778,941 A | 7/1998 | Inada |
| 5,816,848 A | 10/1998 | Zimmerman |
| 6,103,971 A | 8/2000 | Sato et al. |
| 6,160,254 A | 12/2000 | Zimmerman |
| 6,172,344 B1 | 1/2001 | Gordon et al. |
| 6,192,940 B1 | 2/2001 | Koma et al. |
| 6,307,751 B1 | 10/2001 | Bodony |
| 6,339,193 B1 | 1/2002 | Goett et al. |
| 6,349,201 B1 | 2/2002 | Ford |
| 6,591,463 B2 | 7/2003 | Wang |
| 6,711,024 B1 | 3/2004 | Johansson |
| 6,714,431 B2 | 3/2004 | Gamini et al. |
| 6,743,982 B2 | 6/2004 | Biegelsen et al. |
| 6,747,227 B2 | 6/2004 | Marmaropoulos et al. |
| 6,805,568 B2 | 10/2004 | Kuzmenka |
| 7,156,127 B2 | 1/2007 | Moulton et al. |
| 7,191,803 B2 | 3/2007 | Orr et al. |
| 7,234,831 B1 | 6/2007 | Hanley |
| 7,319,895 B2 | 1/2008 | Klefstad-Sillonville |
| 7,491,892 B2 | 2/2009 | Wagner et al. |
| 7,494,238 B2 | 2/2009 | Genz |
| 7,573,727 B2 | 8/2009 | Hauenstein |
| 7,629,691 B2 * | 12/2009 | Roush ............ H01L 23/4985 257/773 |
| 7,641,488 B2 * | 1/2010 | Ho ............... H01R 35/025 439/162 |
| 7,735,523 B2 | 6/2010 | Smith et al. |
| 7,795,540 B2 | 9/2010 | Yamada et al. |
| 8,157,730 B2 | 4/2012 | LeBoeuf |
| 8,207,473 B2 | 6/2012 | Axisa et al. |
| 8,258,011 B2 | 9/2012 | Brun |
| 8,283,602 B2 | 10/2012 | Augustine et al. |
| 8,467,726 B2 | 6/2013 | Shirakata |
| 8,469,741 B2 * | 6/2013 | Oster ............. H01R 13/2414 174/69 |
| 8,861,220 B2 | 10/2014 | Loher |
| 9,018,532 B2 | 4/2015 | Wesselmann et al. |
| 2002/0076948 A1 | 6/2002 | Farrell |
| 2002/0092675 A1 | 7/2002 | Kusaka |
| 2002/0094701 A1 | 7/2002 | Biegelsen |
| 2003/0093248 A1 | 5/2003 | Vock |
| 2003/0098084 A1 | 5/2003 | Ragner et al. |
| 2003/0111126 A1 | 6/2003 | Moulton et al. |
| 2003/0127246 A1 | 7/2003 | Watanabe et al. |
| 2003/0129905 A1 | 7/2003 | Dhawan et al. |
| 2004/0111045 A1 | 6/2004 | Sullivan |
| 2004/0229533 A1 | 11/2004 | Braekevelt |
| 2004/0243204 A1 * | 12/2004 | Maghribi ............ A61N 1/05 607/115 |
| 2004/0259391 A1 | 12/2004 | Jung |
| 2005/0022338 A1 | 2/2005 | Muhlenkamp |
| 2005/0154264 A1 | 7/2005 | Lecompte et al. |
| 2005/0224993 A1 | 10/2005 | Manepalli et al. |
| 2005/0280157 A1 | 12/2005 | Roush et al. |
| 2006/0000633 A1 | 1/2006 | Hopper |
| 2006/0035554 A1 | 2/2006 | Glaser et al. |
| 2006/0128346 A1 | 6/2006 | Yasui |
| 2006/0254811 A1 | 11/2006 | Kirstein |
| 2006/0282018 A1 | 12/2006 | Balzano |
| 2007/0001844 A1 | 1/2007 | Krill |
| 2007/0054511 A1 | 3/2007 | Ittel |
| 2007/0125295 A1 | 6/2007 | Sanguinetti |
| 2007/0190881 A1 | 8/2007 | Shibaoka et al. |
| 2007/0232455 A1 | 10/2007 | Hanoun |
| 2007/0290305 A1 | 12/2007 | Oyama |
| 2008/0060873 A1 | 3/2008 | Lang |
| 2008/0093251 A1 | 4/2008 | Meyer |
| 2008/0157235 A1 | 7/2008 | Rogers |
| 2008/0179082 A1 | 7/2008 | Kinoshita |
| 2008/0180242 A1 | 7/2008 | Cottingham |
| 2008/0182475 A1 | 7/2008 | Gnade |
| 2008/0223844 A1 | 9/2008 | Cronn |
| 2008/0258314 A1 | 10/2008 | Yoo et al. |
| 2008/0269850 A1 | 10/2008 | Dodo |
| 2008/0271220 A1 | 11/2008 | Chilton |
| 2009/0173529 A1 | 7/2009 | Lee et al. |
| 2009/0273460 A1 * | 11/2009 | Mancosu ............ B60C 23/0452 340/445 |
| 2009/0309739 A1 | 12/2009 | Ezer |
| 2009/0315320 A1 | 12/2009 | Finn |
| 2009/0317639 A1 | 12/2009 | Axisa et al. |
| 2010/0090834 A1 | 4/2010 | Buchnick |
| 2010/0276497 A1 | 11/2010 | Seban et al. |
| 2010/0325770 A1 | 12/2010 | Chung |
| 2011/0063098 A1 | 3/2011 | Fischer |
| 2011/0119812 A1 | 5/2011 | Genz et al. |
| 2011/0130060 A1 | 6/2011 | Chung et al. |
| 2011/0175630 A1 | 7/2011 | Bhattacharya |
| 2011/0217528 A1 | 9/2011 | Wiercinski et al. |
| 2011/0245633 A1 | 10/2011 | Goldberg |
| 2012/0050036 A1 | 3/2012 | Landry |
| 2012/0051005 A1 | 3/2012 | Vanfleteren |
| 2012/0053424 A1 | 3/2012 | Kenalty et al. |
| 2012/0176764 A1 | 7/2012 | Loher |
| 2012/0314382 A1 | 12/2012 | Wesselmann et al. |
| 2013/0160183 A1 * | 6/2013 | Reho ............... A41D 13/1281 2/69 |
| 2013/0161055 A1 * | 6/2013 | Rule ............... H01B 7/06 174/69 |
| 2013/0216065 A1 | 8/2013 | Nguyen |
| 2013/0247288 A1 | 9/2013 | Kotos |
| 2013/0256004 A1 * | 10/2013 | Cotton ............. H05K 1/0283 174/254 |
| 2014/0103116 A1 | 4/2014 | Martin |
| 2014/0209690 A1 | 7/2014 | Teng |
| 2014/0275857 A1 | 9/2014 | Toth |
| 2014/0299362 A1 | 10/2014 | Park |
| 2014/0362020 A1 | 12/2014 | Rothkopf |
| 2015/0009129 A1 | 1/2015 | Song |
| 2015/0041201 A1 | 2/2015 | Van Heck |
| 2015/0091711 A1 | 4/2015 | Kosonen |
| 2015/0109124 A1 | 4/2015 | He |
| 2015/0185944 A1 | 7/2015 | Magi |
| 2015/0245777 A1 | 9/2015 | Della Torre |
| 2015/0312653 A1 | 10/2015 | Avrahami |
| 2016/0020500 A1 | 1/2016 | Matsuda |
| 2016/0034634 A9 | 2/2016 | Hong |
| 2016/0187122 A1 | 6/2016 | Krimon |

* cited by examiner

METHOD OF MAKING STRETCHABLE INTERCONNECT USING MAGNET WIRES

RELATED APPLICATIONS

This patent application is a continuation-in-part of U.S. patent application Ser. No. 14/145,815, filed Dec. 31, 2013, and entitled "Stretchable Metal Wire Assembly". U.S. patent application Ser. No. 14/145,815 claims priority under 35 U.S.C. 119(e) of the U.S. Provisional Application Ser. No. 61/870,627, filed Aug. 27, 2013, and entitled "Interconnect Methods" and U.S. Provisional Application Ser. No. 61/870,646, filed Aug. 27, 2013, and entitled "Stretchable Metals". This patent application also claims priority under 35 U.S.C. 119(e) of the U.S. Provisional Application Ser. No. 61/913,830, filed Dec. 9, 2013, and entitled "Metal Fabric Stitching and Stretchable Batteries". This patent application incorporates U.S. patent application Ser. No. 14/145,815, U.S. Provisional Application Ser. No. 61/870,627, U.S. Provisional Application Ser. No. 61/870,646 and U.S. Provisional Application Ser. No. 61/913,830 in their entireties by reference.

FIELD OF THE INVENTION

The present invention is generally directed to the field of metal wires and electrical conductivity over the metal wires. More specifically, the present invention is directed to a stretchable metal wire assembly and electrical conductivity over the stretchable metal wire assembly.

BACKGROUND OF THE INVENTION

Electronic devices are increasingly being incorporated with stretchable materials, such as in wearable electronics. Metal wires are commonly used as electrical conductors in electronic devices. Although metal wires are bendable, such as in an electric cord, metal wires are themselves not stretchable. There is an ever increasing need to enable use of non-stretching metal wires with electronics devices implemented within stretchable materials.

SUMMARY OF THE INVENTION

Embodiments of a stretchable wire assembly are directed to a metal wire coupled between two elastic substrates. The two elastic substrates are coupled together, and the metal wire is attached to one or both elastic substrates at select locations. The form of the metal wire is such that when the elastic substrates are in a relaxed, or non-stretched, state the metal wire forms a tortuous path, such as a waveform, along the coupled elastic substrates. The tortuous path of the metal wire provides slack such that as the elastic substrates are stretched the slack is taken up. A maximum stretched position corresponds to where the metal wire forms a straight line. Once released, the elastic substrates move from the stretched position to the relaxed, non-stretched position, and slack is reintroduced into the metal wire in the form of the original tortuous path. In some embodiments, the metal wire is a magnet wire that has an outer insulation layer.

In an aspect, a stretchable metal wire assembly is disclosed. The stretchable metal wire assembly includes a first elastic substrate, a metal wire and a second elastic substrate. The first elastic substrate has a relaxed, non-stretched state, and is configured to be stretched along at least a first direction when a stretching force is applied along the first direction, and to return to the non-stretched state when the stretching force is removed. The metal wire is coupled to the first elastic substrate, wherein the metal wire forms a tortuous path relative to at least the first direction when the first elastic substrate is in the non-stretched state thereby enabling bending of the metal wire along at least the first direction upon application and removal of the stretching force. The second elastic substrate is coupled to the first elastic substrate such that the metal wire is positioned between the first elastic substrate and the second elastic substrate.

In some embodiments, the second elastic substrate has a relaxed, non-stretched state, and is configured to be stretched along at least the first direction when the stretching force is applied along the first direction, and to return to the non-stretched state when the stretching force is removed. In some embodiments, the first elastic substrate and the second elastic substrate are configured to be stretched along a second direction different than the first direction and the metal wire forms the tortuous path relative to the first direction and the second direction. In some embodiments, the first elastic substrate has a first perimeter edge and a second perimeter edge, and the second elastic substrate has a first perimeter edge and a second perimeter edge, wherein the second elastic substrate is coupled to the first elastic substrate proximate the first perimeter edge of each of the first elastic substrate and the second elastic substrate, and the second elastic substrate is coupled to the first elastic substrate proximate the second perimeter edge of each of the first elastic substrate and the second elastic substrate, thereby enabling the metal wire to move freely between the first perimeter edges and the second perimeter edges.

In some embodiments, the stretchable metal wire assembly also includes one or more adhesion joints wherein each adhesion joint couples a portion of the metal wire to a corresponding portion of the first elastic substrate. In some embodiments, the portion of the metal wire is coupled to the corresponding portion of the first elastic substrate at the adhesion joint using an adhesive material. In other embodiments, the portion of the metal wire is coupled to the corresponding portion of the first elastic substrate at the adhesion joint using stitching. In some embodiments, the first elastic substrate has a first perimeter edge and a second perimeter edge, and the second elastic substrate has a first perimeter edge and a second perimeter edge, wherein the second elastic substrate is coupled to the first elastic substrate proximate the first perimeter edge of each of the first elastic substrate and the second elastic substrate, and the second elastic substrate is coupled to the first elastic substrate proximate the second perimeter edge of each of the first elastic substrate and the second elastic substrate, thereby enabling the metal wire to move freely between the first perimeter edges and the second perimeter edges except at the one or more adhesion joints. In some embodiments, the first elastic substrate is coupled to the second elastic substrate proximate the first perimeter edges and the first elastic substrate is coupled to the second elastic substrate proximate the second perimeter edges using an adhesive material. In other embodiments, the first elastic substrate is coupled to the second elastic substrate proximate the first perimeter edges and the first elastic substrate is coupled to the second elastic substrate proximate the second perimeter edges using stitching. In some embodiments, the second elastic substrate is further coupled to the first elastic substrate along one or more select cross-sections extending from the first perimeter edges and the second perimeter edges, each cross-section intersecting one of the adhesion joints, thereby forming regions each bounded by the first perimeter edges, the second perimeter edges, and at least one cross-section within which the metal wire moves freely. In some embodiments, the first elastic substrate is coupled to the second elastic substrate along the select one or more cross-sections using an adhesive material. In other embodiments, the first elastic substrate is coupled to the second elastic substrate along the select one or more cross-sections using stitching.

In some embodiments, the stretchable metal wire assembly also includes a first electrical interconnect component coupled to a first end of the metal wire and a second electrical interconnect component coupled to a second end of the metal wire. In some embodiments, the stretchable metal wire assembly also includes an elastic mold layer coupled to the first electrical interconnect component, the second electrical interconnect component and a portion of the metal wire exposed from the first elastic substrate and the second elastic substrate. In some embodiments, the stretchable metal wire assembly also includes one or more additional metal wires positioned adjacent to the metal wire and electrically isolated from each other, where each additional metal wire forms the tortuous path. In some embodiments, the first elastic substrate and the second elastic substrate are made of one or more of an elastomer, silicone, urethane, latex and elastane. In some embodiments, the metal wire is made of one or more of gold, silver, copper, nickel and their alloys. In some embodiments, the metal wire is a magnet wire.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a stretchable metal wire assembly. Those of ordinary skill in the art will realize that the following detailed description of the stretchable metal wire assembly is illustrative only and is not intended to be in any way limiting. Other embodiments of the stretchable metal wire assembly will readily suggest themselves to such skilled persons having the benefit of this disclosure.

Reference will now be made in detail to implementations of the stretchable metal wire assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
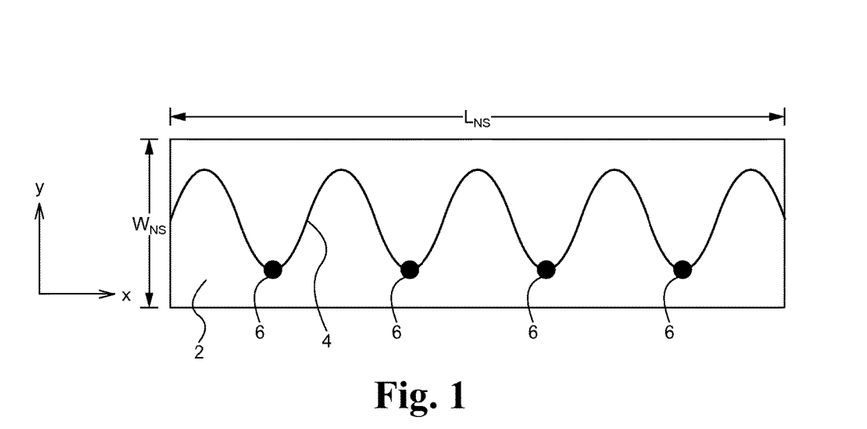
FIG. 1 illustrates a side view of a stretchable metal wire assembly according to an embodiment.

FIG. 1 illustrates a side view of a stretchable metal wire assembly according to an embodiment. The stretchable metal wire assembly includes an elastic substrate 2 and a metal wire 4 coupled to the elastic substrate 2. As shown in FIG. 1, the stretchable metal wire assembly is in a relaxed, or non-stretched, state. In the non-stretched state, the metal wire 4 forms a tortuous path relative to a stretchable direction of the elastic substrate 2, in this case the elastic substrate 2 is stretchable in both the x and y axis. In this manner, slack in the metal wire 4 is introduced relative to the direction of motion when the stretchable metal wire assembly is stretched. In some embodiments, the elastic substrate 2 is an elastic polymer, or elastomer, which is a polymer with viscoelasticity. It is understood that alternative elastic substrates can be used including, but not limited to, silicone, urethane, latex and spandex, also referred to as elastane.

In some embodiments, the metal wire 4 is secured to the elastic substrate 2 at a plurality of adhesion joints 6. The metal wire 4 can be secured to the elastic substrate 2 at each adhesion joint 6 using any known attach material that is capable of fixing in place the metal wire 4 to the elastic substrate 2 at the adhesion joint 6. Examples of such attach material include, but are not limited to silicone adhesive or epoxy based adhesive. The type of attach material used is dependent on the material used as the elastic substrate, the material used as the metal wire and the ability of the attach material to attach to these materials. In some embodiments, the metal wire 4 is stitched to the elastic substrate 2 at the adhesion joint 6. In other embodiments, both adhesive and stitching are used to attach the metal wire 4 to the elastic substrate 2 at the adhesion joint 6.

Figure 2:
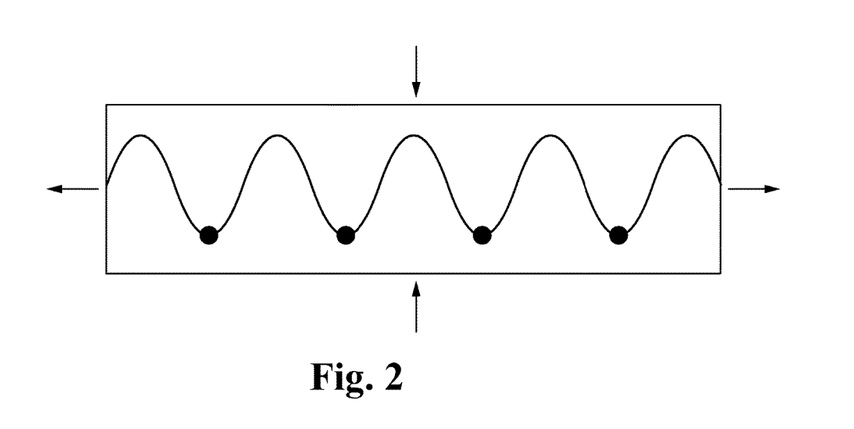
FIG. 2 illustrates exemplary force characteristics applied to the stretchable metal wire assembly of FIG. 1.
Figure 3:
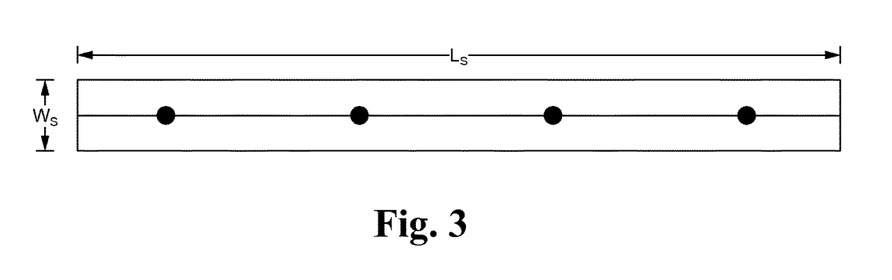
FIG. 3 illustrates the stretchable metal wire assembly in a stretched state.
Figure 4A:
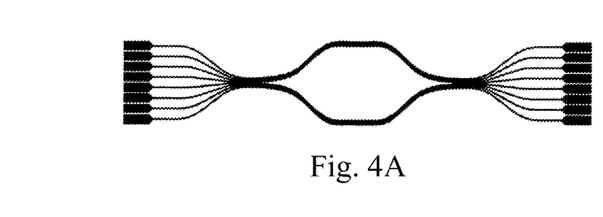
FIGS. 4A-4H illustrate exemplary alternative metal wire configurations.
Figure 4B:
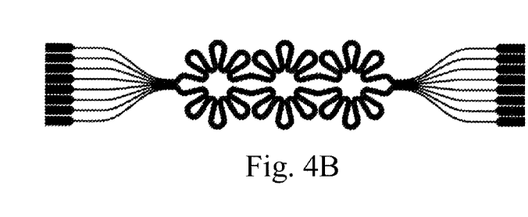
Figure 4C:
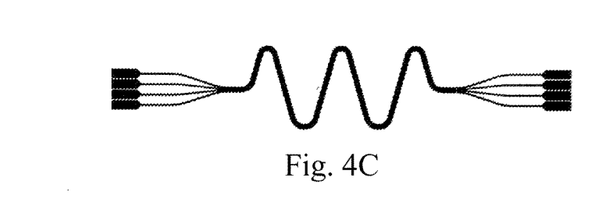
Figure 4D:
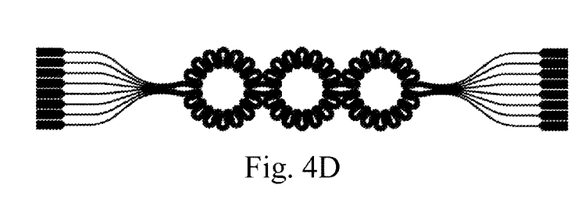
Figure 4E:
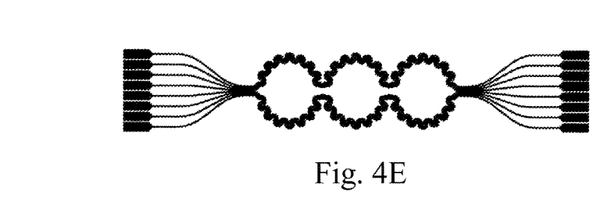
Figure 4F:
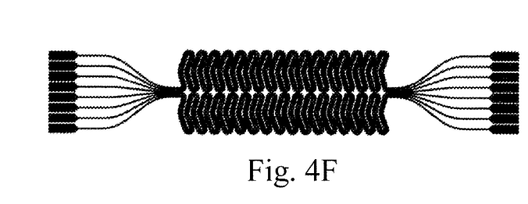
Figure 4G:
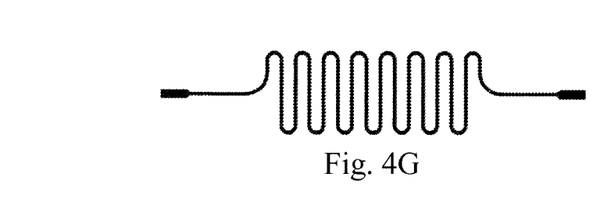
Figure 4H:
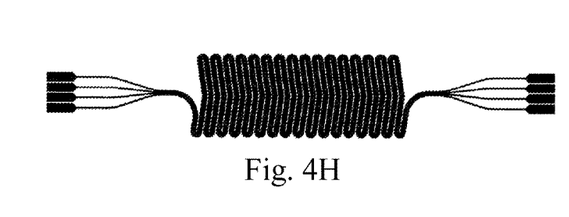

FIG. 1 shows the stretchable metal wire assembly in a non-stretched state. In the non-stretched state, the elastic substrate 2 has a non-stretched length $L_{NS}$ and a non-stretched width $W_{NS}$. When the elastic substrate 2 is stretched in the x-direction, there is a complementary compression of the elastic substrate 2 in the y-direction, as indicated by the force arrows in FIG. 2. The elastic substrate 2 can be stretched until a maximum stretched position where the metal wire forms a straight line, as shown in FIG. 3. In the maximum stretched position, the elastic substrate 2 has a stretched length $L_S$ and a stretched width $W_S$, where the stretched length $L_S$ is greater than the non-stretched length $L_{NS}$ and the stretched width $W_S$ is less than the non-stretched width $W_{NS}$. In practice, the stretchable metal wire assembly is designed to have a maximum stretchable length that is less than the distance corresponding to the metal wire forming a straight line. In this case, the maximum stretchable length is a function of the maximum stretchable length of the elastic substrate or some other limiting factor. Such a configuration minimizes metal fatigue by minimizing extreme bending back and forth of the metal wire that comes with stretching and releasing of the elastic substrate.

In the example shown above, the elastic substrate 2 is stretched in the x-direction. It is understood that the stretchable metal wire assembly can also be configured to accommodate stretching in the y-direction and/or the z-direction, where the z-direction is into and out of the page in relation to the FIGS. 1-3. The amount by which the elastic substrate 2 can be stretched in any direction is a function of the slack provided relative to that specific direction. In the case of y-direction stretching as applied to the exemplary metal wire waveform shown in FIG. 1, the metal wire 2 does not straighten toward a single straight line as with stretching in the x-direction. Instead, stretching in the y-direction compresses the metal wire 2 along the x-direction, moving the peaks and valleys of the meal wire waveform toward each other in the x-direction. It is understood that simultaneous stretching in multiple directions results in reducing the maximum stretchable limit in any one direction.

Figure 5:
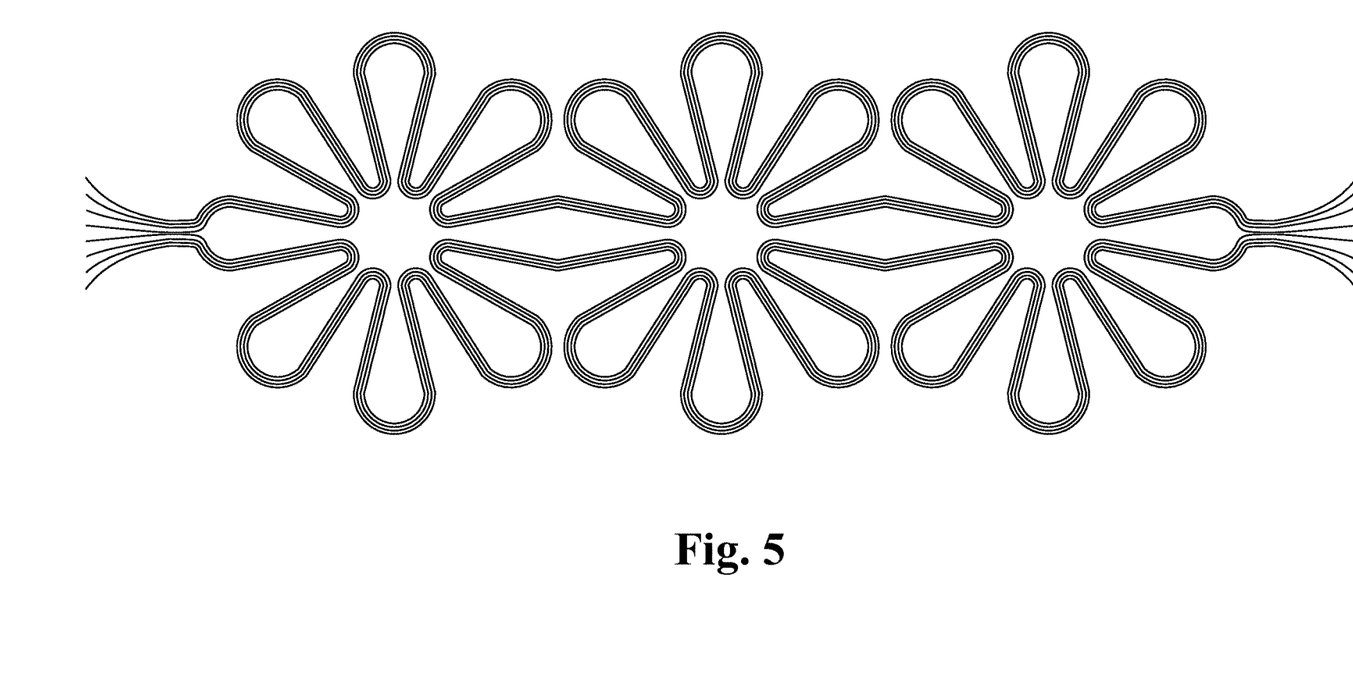
FIG. 5 illustrates the metal wire configuration of FIG. 4B in finer detail.

In the exemplary configuration shown in FIG. 1, the metal wire 4 has a sinusoidal waveform. In alternative embodiments, the metal wire can be configured to have other forms or patterns. FIG. 1 also shows the stretchable metal wire assembly having a single metal wire. In alternative embodiments, the stretchable metal wire assembly can include multiple metal wires, each electrically isolated from each other. FIGS. 4A-4H illustrate exemplary alternative metal wire configurations. Each configuration provides varying amounts of stretchability in the x, y and z-directions. All but FIG. 4G include configurations having multiple metal wires. Although the configurations having multiple metal wires appear to converge to a single wire in the middle section, this is simply due to the scale shown in FIGS. 4A-4F and 4H. Although not detailed in FIGS. 4A-4F and 4H, the multiple metal wires are separate and electrically isolated from each other. FIG. 5 illustrates the metal wire configuration of FIG. 4B in finer detail. As shown in FIG. 5, each of the eight individual metal wires are separate and electrically isolated from each other. The number of metal wires, the pattern for stretchability, and the distance between adjacent metal wires is based on application requirements.

Figure 6:
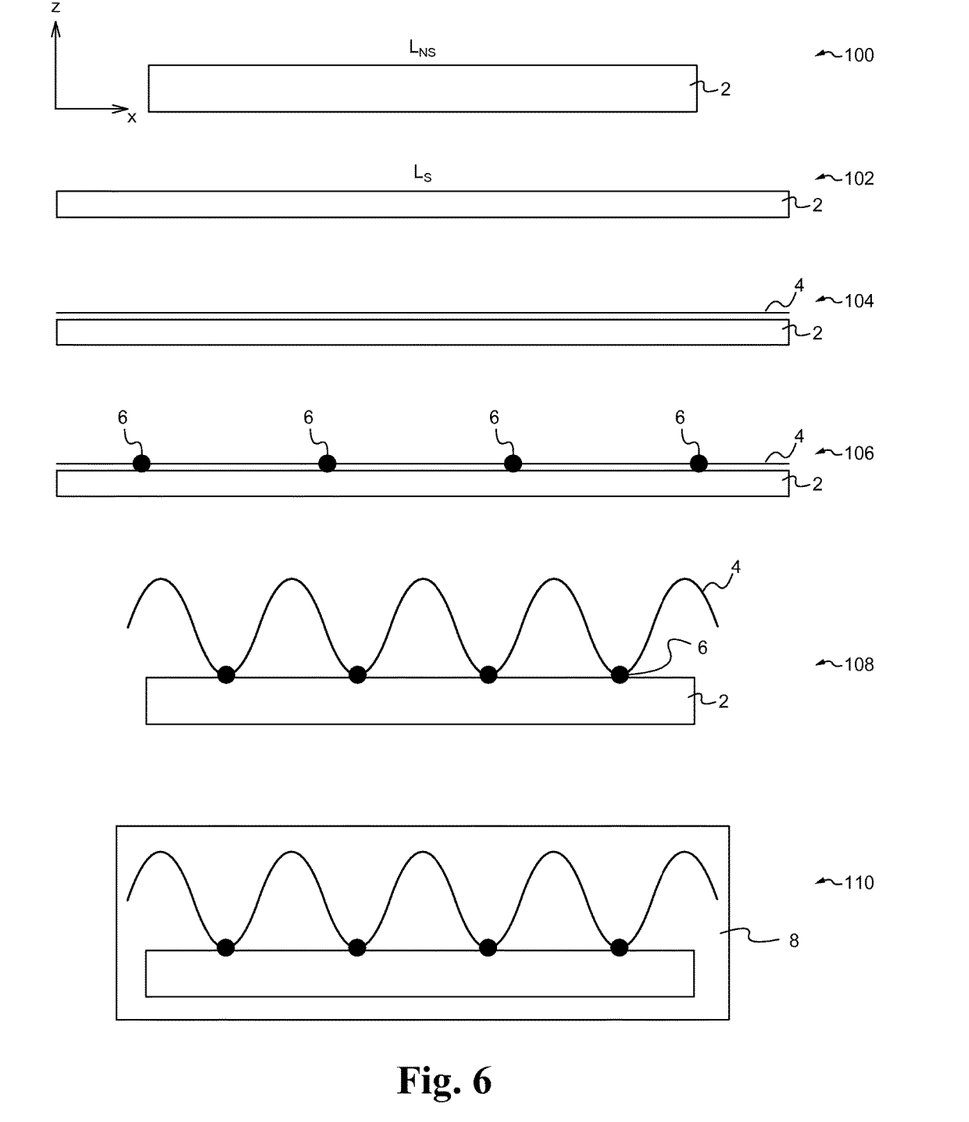
FIG. 6 illustrates a method of fabricating a stretchable metal wire assembly according to an embodiment.

In some embodiments, the metal wire is a small diameter wire separately applied to the elastic substrate. FIG. 6 illustrates a method of fabricating a stretchable metal wire assembly according to an embodiment. At a step 100, the elastic substrate 2 is selected. At the step 102, the elastic substrate is stretched. In some embodiments, a tool is used to grip each end of the elastic substrate, pull the ends apart to stretch the elastic substrate to a desired stretched length, and to hold the elastic substrate in the stretched state.

At the step 104, the metal wire 4 is positioned on the stretched elastic substrate 2. In some embodiments, the metal wire is made of one or more of gold, silver, copper, nickel, their alloys, and any other material used in conventional wire bonding. In some embodiments, the metal wire 4 is configured as a straight line when placed on the stretched elastic substrate 2. In this case, the stretched elastic substrate has a stretched length $L_S$ that is equal to the maximum stretched length. In some embodiments, more than one metal wire 4 is positioned on the stretched elastic substrate, where each metal wire is electrically isolated from other metal wires.

At the step 106, the metal wire 4 is secured to the stretched elastic substrate 2. In some embodiments, the metal wire 4 is coupled to the stretched elastic substrate 2 at multiple adhesion joints 6. An adhesive such as silicone adhesive or epoxy-based adhesive can be used. The distance between adhesion joints is application and materials specific. The adhesive is then cured, either at room temperature, elevated temperature or using ultraviolet light, depending on the type of adhesive used. Alternatively, the metal wire 4 is stitched to the stretched elastic substrate 2 at the multiple adhesion joints 6. Still alternatively, both adhesive and stitching are used to attach the metal wire 4 to the stretched elastic substrate 2 at the multiple adhesion joints 6. In some embodiments, the metal wire 4 is pre-coated with polymer, such as silicone or urethane, or other adhesive material to promote adhesion between the metal wire and the elastic substrate, and to prevent shorting between neighboring metal wires in a multiple wire configuration.

At the step 108, the stretched elastic substrate 2 is released and returns to its relaxed, non-stretched state. The contracting force of the elastic substrate 2 shapes the metal wire 4 into a tortuous path. In some embodiments, the shape of the tortuous path is formed by the specific placement of the adhesion joints 6 and/or by the elastic characteristics of the elastic substrate 2. In the exemplary configuration shown in FIG. 6, the metal wire 4 forms a tortuous path in the x-z plane, whereas in the exemplary configuration shown in FIG. 1 the metal wire 4 forms a tortuous path in the x-y plane. In general, the metal wire 4 can form a tortuous path in any two or three-dimensional space that includes at least a portion of the elastic substrate 2.

At the step 110, a mold layer 8 is applied over the elastic substrate 2 and metal wire 4. The mold layer 8 is an elastic material, which can be the same or different material than that of the elastic substrate 2.

In other embodiments, the metal wire is not a separate element attached to the elastic substrate, but instead the metal wire is formed as a conductive ink printed onto the non-stretched elastic substrate, such as by inkjet printers or screen printing. The conductive ink is printed in any desired pattern, such as those shown in FIGS. 4A-4H. Once the metal wire is printed onto the elastic substrate, a mold layer is applied as in the step 110 above.

In other embodiments, the metal wire can be woven into the stretched or non-stretched elastic substrate, with or without subsequent adhesion joints being applied. In still other embodiments, a channel can be formed in the elastic substrate such that in the non-stretched state the channel forms the desired tortuous path pattern. The metal wire can be positioned in the channel while the elastic substrate is either stretched or non-stretched. Adhesive and/or stitching can be subsequently applied to secure the metal wire in the channel, followed by a mold layer.

Figure 7:
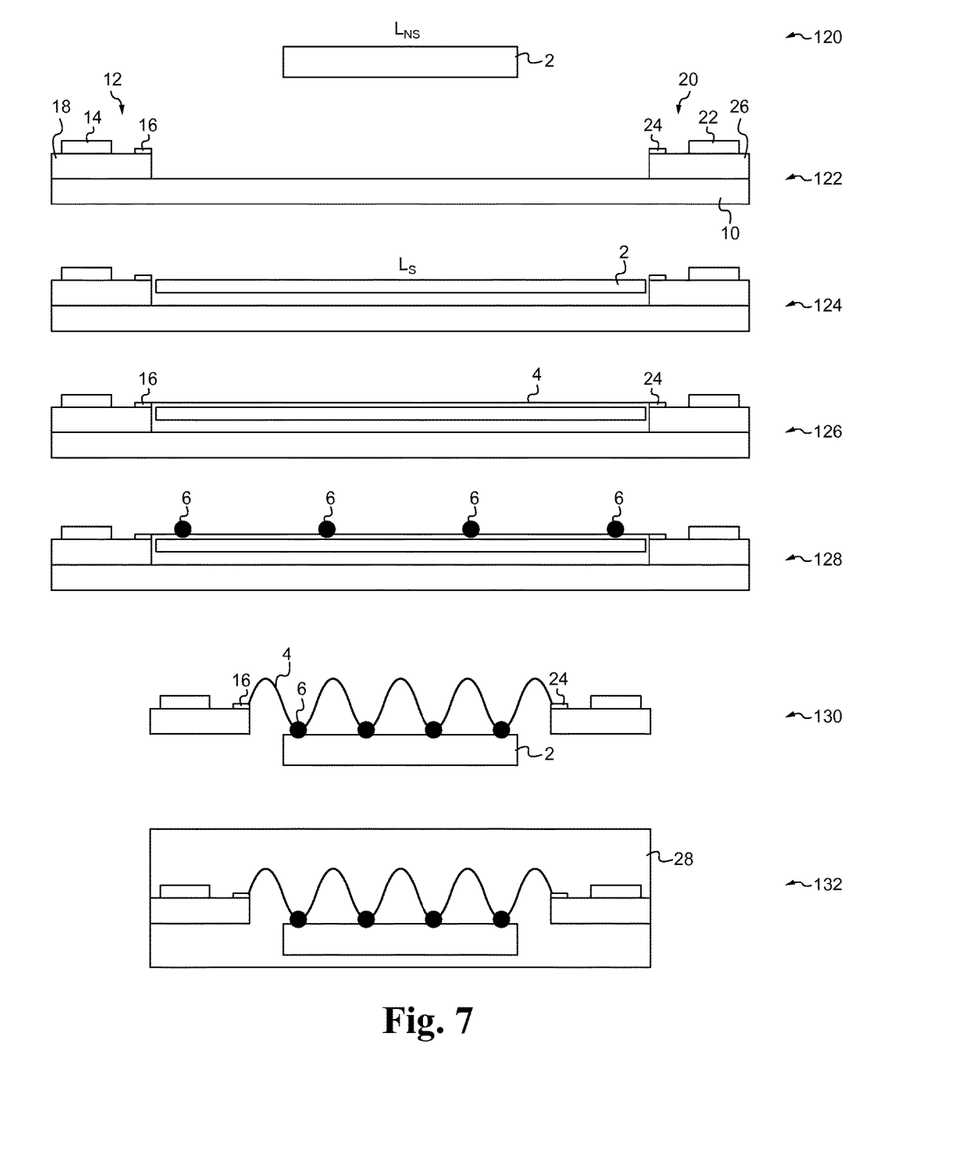
FIG. 7 illustrates a method of fabricating a stretchable metal wire assembly according to another embodiment.

The stretchable meal wire assembly can also include additional components, such as electrical interconnect components, or simply interconnect components, coupled to the end of each metal wire. FIG. 7 illustrates a method of fabricating a stretchable metal wire assembly according to another embodiment. At a step 120, the elastic substrate 2 is selected. At the step 122, one or more components are temporarily coupled to a carrier substrate 10. The carrier substrate 10 is configured such that the components can be placed, temporarily held in position and subsequently removed from the carrier substrate. In some embodiments, there is one component to be coupled to each end of each metal wire 4. In some embodiments, each component is a printed circuit board assembly (PCBA) or packaged electronic device. In the exemplary configuration shown in FIG. 7, a PCBA 12 and a PCBA 18 are coupled to the carrier substrate 10. The PCBA 12 includes at least one electronic component 14 and at least one metal pad 16 coupled to a printed circuit board (PCB) 18. The PCBA 20 includes at least one electronic component 22 and at least one metal pad 26 coupled to a PCB 26.

At the step 124, the elastic substrate 2 is positioned between the PCBA 12 and the PCBA 20, and the elastic substrate is stretched. The elastic substrate 2 can be positioned on the carrier substrate 10 or can be suspended above the carrier substrate 10. In some embodiments, a tool is used to grip each end of the elastic substrate, pull the ends apart to stretch the elastic substrate to a desired stretched length, and to hold the elastic substrate in the stretched state.

At the step 126, the metal wire 4 is positioned on the stretched elastic substrate 2. In some embodiments, the metal wire 4 is configured as a straight line when placed on the stretched elastic substrate 2. In this case, the stretched elastic substrate has a stretched length $L_S$ that is equal to the maximum stretched length. A first end of the metal wire 4 is coupled to the metal pad 16 on the PCBA 12 and a second end of the metal wire 4 is coupled to the metal pad 20 on the PCBA 20. The metal wire ends can be coupled to the metal pads using any conventional means that enable electrical connectivity including, but not limited to, soldering, welding or conducting adhesives. In some embodiments, more than one metal wire 4 is positioned on the stretched elastic substrate, where each metal wire is electrically isolated from other metal wires. In this case, each of the PCBAs 12 and 20 can be configured with additional metal pads, one metal pad to be coupled to one end of one of the metal wires. Alternatively, additional PCBAs can be added where the multiple metal wires can be coupled in any combination of one or more metal wires to one or more PCBAs.

At the step 128, the metal wire 4 is secured to the stretched elastic substrate 4. In some embodiments, the metal wire 4 is coupled to the stretched elastic substrate 2 at multiple adhesion joints 6. In some embodiments, the metal wire 4 is pre-coated with polymer to promote adhesion between the metal wire and the elastic substrate, and to prevent shorting between neighboring metal wires in a multiple wire configuration.

At the step 130, the carrier substrate 10 is removed. The stretched elastic substrate 2 is released and returns to its relaxed, non-stretched state. The contracting force of the elastic substrate 2 shapes the metal wire 4 into a tortuous path. In some embodiments, the shape of the tortuous path is formed by the specific placement of the adhesion joints 6 and/or by the elastic characteristics of the elastic substrate 2. The metal wire 4 can form a tortuous path in any two or three-dimensional space. It is understood that the tortuous path can be formed using any of the previously described methods including, but not limited to, weaving the metal wire into the stretched or non-stretched elastic substrate, forming channels in the elastic substrate and positioning the metal wire within the channel, or printing conductive ink onto the elastic substrate to form the metal wire.

At the step 132, a mold layer 28 is applied over the elastic substrate 2, the metal wire 4, the PCBA 12 and the PCBA 20. The mold layer 28 is an elastic material, which can be the same or different material than that of the elastic substrate 2. In some embodiments, an electrical interface to one or both electrical interconnect components is left exposed so as to provide an external electrical connectivity. Such an interface can include, but is not limited to, a metal pad, a metal wire coming off the electrical interconnect component or an interface plug that is part of the electrical interconnect component.

Figure 8:
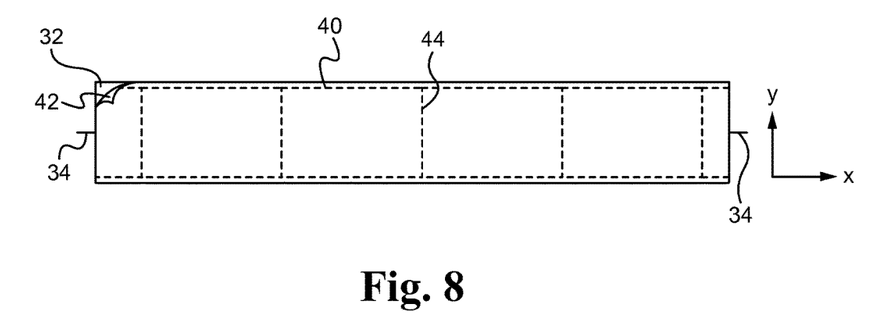
FIG. 8 illustrates a side view of a stretchable metal wire assembly having two elastic substrates according to an embodiment.
Figure 9:
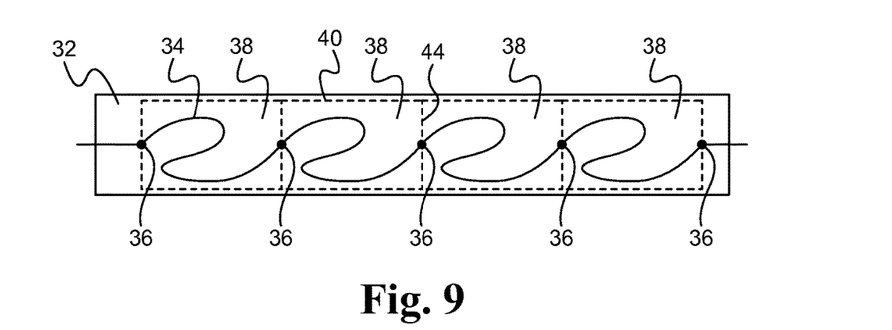
FIG. 9 illustrates the stretchable metal wire substrate of FIG. 8 with the second elastic substrate removed.

In some embodiments, the stretchable metal wire assembly includes a second elastic substrate, which is coupled to the first elastic substrate with the metal wire positioned between the two substrates. FIG. 8 illustrates a side view of a stretchable metal wire assembly having two elastic substrates according to an embodiment. The stretchable metal wire assembly includes a first elastic substrate 32, a second elastic substrate 42 and a metal wire 34 positioned between the first elastic substrate 32 and the second elastic substrate 42. The top left corner of the second substrate 42 is shown as being peeled back in FIG. 8 for illustrative purposes only. FIG. 9 illustrates the stretchable metal wire substrate of FIG. 8 with the second elastic substrate 42 removed. The configuration of the first elastic substrate 32 and the metal wire 34 of the stretchable metal wire assembly of FIGS. 8 and 9 can be similar to the elastic substrate and the metal wire of the stretchable metal wire assemblies shown in FIGS. 1-6.

As shown in FIG. 9, the stretchable metal wire assembly is in a relaxed, or non-stretched, state. In the non-stretched state, the metal wire 34 forms a tortuous path relative to a stretchable direction of the first elastic substrate 32, in this case the first elastic substrate 32 is stretchable in both the x and y axis. In this manner, slack in the metal wire 34 is introduced relative to the direction of motion when the stretchable metal wire assembly is stretched. The tortuous path of the metal wire 34 shown in FIG. 9 is for exemplary purposes only. In some embodiments, the first elastic substrate 32 is an elastic polymer, or elastomer, which is a polymer with viscoelasticity. It is understood that alternative elastic substrates can be used including, but not limited to, silicone, urethane, latex and spandex, also referred to as elastane.

In some embodiments, the metal wire 34 is secured to the first elastic substrate 32 at a plurality of adhesion joints 36. The metal wire 34 can be secured to the first elastic substrate 2 at each adhesion joint 36 using any known attach material that is capable of fixing in place the metal wire 34 to the first elastic substrate 32 at the adhesion joint 36. Examples of such attach material include, but are not limited to silicone adhesive or epoxy based adhesive. The type of attach material used is dependent on the material used as the elastic substrate, the material used as the metal wire and the ability of the attach material to attach to these materials. In some embodiments, the metal wire 34 is stitched to the first elastic substrate 32 at the adhesion joint 36. In other embodiments, both adhesive and stitching are used to attach the metal wire 34 to the first elastic substrate 32 at the adhesion joint 36. Materials used for stitching threads can include, but are not limited to, metal, cotton, wool, nylon, polyester or other synthetic materials.

In some embodiments, the metal wire is made of one or more of gold, silver, copper, nickel, and their alloys. In some embodiments, the metal wire is coated or otherwise covered by an outer insulation layer. In an exemplary application, the metal wire is a magnet wire. Magnet wire is typically made of a copper or aluminum wire coated with a very thin layer of insulation. Magnet wire is referred to as "magnet" due to its electromagnetic applications. Magnet wires can be used in the construction of transformers, inductors, motors, speakers, hard disk head actuators, potentiometers, electromagnets, and other applications which require tight coils of wire. The metal wire itself is most often fully annealed, electrolytically refined copper. Smaller diameter magnet wire usually has a round cross section. Thicker magnet wire is often square or rectangular with rounded corners to provide more current flow per coil length.

In some embodiments, magnet wire includes one to four layers of polymer film insulation, often of two different compositions, to provide a tough, continuous insulating layer. Materials used for magnet wire insulating films can include, but are not limited to, polyvinyl formal (Formvar™), polyurethane, polyamide, polyester, polyester-polyimide, polyamide-polyimide (or amide-imide), and polyimide. Polyimide insulated magnet wire is capable of operation at up to 250° C. In other embodiments, different types of insulation are used including, but not limited to, fiberglass yarn with varnish, aramid paper, kraft paper, mica, and polyester film. It is understood that are types of magnet wires can be used, for example a silver wire having various insulators, such as polytetrafluoroethylene (Teflon™), such as that found in the audio industry. For ease of manufacturing, newer magnet wires can have insulation that acts as a flux when burnt during soldering. This results in magnet wires having electrical connections at the ends that can be made without stripping off the insulation first. Older magnet wires do not have this type of insulation and can require sandpapering or scraping to remove the insulation before soldering.

Referring again to FIGS. 8 and 9, the first elastic substrate 32 and the second elastic substrate 42 are coupled to each other proximate their respective perimeter edges, for example the horizontal dashed lines 40. The first elastic substrate 32 and the second elastic substrate 42 remain unattached in the region between the horizontal dashed lines 40, enabling the metal wire 34 to move freely between the two substrates, other than where the metal wire 34 is coupled to the first elastic substrate 32 at the adhesion joints 36. In some embodiments, the unattached region between the horizontal dashed lines 40 is sub-divided by further coupling the first elastic substrate 32 to the second elastic substrate 42 at select locations. In the exemplary application shown in FIGS. 8 and 9, the first elastic substrate 32 is further coupled to the second elastic substrate 42 along vertical dashed lines 44. The vertical dashed lines 44 sub-divide the unattached region into multiple unattached regions 38, four of which are shown in FIGS. 8 and 9. The dashed lines 40 and 44 form the perimeter each region 38. In some embodiments, each vertical dashed line 44 intersects an adhesion joint 36.

In some embodiments, the first elastic substrate 32 and the second elastic substrate 42 are coupled together at the dashed lines 40 and the dashed lines 44 using an adhesive. In other embodiments, the first elastic substrate 32 and the second elastic substrate 42 are stitched together at the dashed lines 40 and the dashed lines 44. In still other embodiments, the first elastic substrate 32 and the second elastic substrate 42 are coupled together at the dashed lines 40 and the dashed lines 44 using both an adhesive and stitching.

In the exemplary configuration shown in FIGS. 8 and 9, the stretchable metal wire assembly has a single metal wire. In alternative embodiments, the stretchable metal wire assembly can include multiple metal wires, each electrically isolated from each other.

The stretchable meal wire assembly can also include additional components, such as electrical interconnect components, or simply interconnect components, coupled to the end of each metal wire. An exemplary type of interconnect component is shown in FIG. 7. It is understood that alternative types and configurations of interconnect components can be used.

The stretchable metal wire assembly having two elastic substrates can be fabricated using similar methodologies as those previously described related to the single elastic substrate configurations. The metal wire 34 is formed and attached to the first elastic substrate 32 using any of the steps described above. The second elastic substrate 42 is then coupled to the first elastic substrate 42 such that the metal wire 34 is positioned between the two substrates. For example, the second elastic substrate 42 is positioned on top of the metal wire 34 and the first elastic substrate 32, then the first elastic substrate 32 and the second elastic substrate 42 are stitched together, such as along the dashed lines 40 and 44. The first elastic substrate 32 and the second elastic substrate 42 are coupled together such that one or more regions remain unattached, thereby enabling the metal wire to move freely, either entirely or in part, within the unattached region(s). In the case where an additional component is are coupled to one or more ends of the metal wire, the additional component can be coupled using a methodology similar to that shown in FIG. 7. An encapsulation layer can also be added to encapsulate the added component and/or any portion of the metal wire that may be exposed. Such an encapsulation layer may or may not cover all or some of the two elastic substrates.

The present application has been described in terms of specific embodiments incorporating details to facilitate the understanding of the principles of construction and operation of the stretchable metal wire assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A stretchable metal wire assembly comprising:
   a. a first elastic substrate having a relaxed, non-stretched state, wherein the first elastic substrate is configured to be stretched along at least a first direction when a stretching force is applied along the first direction, and to return to the non-stretched state when the stretching force is removed, further wherein the first elastic substrate has a first perimeter edge and a second perimeter edge;
   b. a metal wire coupled to the first elastic substrate, wherein the metal wire forms a tortuous path relative to at least the first direction when the first elastic substrate is in the non-stretched state thereby enabling bending of the metal wire along at least the first direction upon application and removal of the stretching force;
   c. one or more adhesion joints wherein each adhesion joint fixedly attaches a portion of the metal wire to a corresponding portion of the first elastic substrate; and
   d. a second elastic substrate coupled to the first elastic substrate such that the metal wire is positioned between the first elastic substrate and the second elastic substrate, further wherein the second elastic substrate has a first perimeter edge and a second perimeter edge, wherein the second elastic substrate is fixedly attached to the first elastic substrate proximate the first perimeter edges of each of the first elastic substrate and the second elastic substrate, and the second elastic substrate is fixedly attached to the first elastic substrate proximate the second perimeter edges of each of the first elastic substrate and the second elastic substrate, wherein the second elastic substrate is further fixedly attached to the first elastic substrate along one or more select cross-sections extending from the first perimeter edges and the second perimeter edges, each cross-section intersecting one of the adhesion joints, thereby forming regions each bounded by the fixedly attached first perimeter edges, the fixedly attached second perimeter edges, and two fixedly attached cross-sections, within each region the first elastic substrate and the second elastic substrate are unattached and the metal wire moves freely relative to the first elastic substrate and the second elastic substrate.

2. The stretchable metal wire assembly of claim 1 wherein the second elastic substrate has a relaxed, non-stretched state, further wherein the second elastic substrate is configured to be stretched along at least the first direction when the stretching force is applied along the first direction, and to return to the non-stretched state when the stretching force is removed.

3. The stretchable metal wire assembly of claim 2 wherein the first elastic substrate and the second elastic substrate are configured to be stretched along a second direction different than the first direction and the metal wire forms the tortuous path relative to the first direction and the second direction.

4. The stretchable metal wire assembly of claim 1 wherein the portion of the metal wire is fixedly attached to the corresponding portion of the first elastic substrate at the adhesion joint using an adhesive material.

5. The stretchable metal wire assembly of claim 1 wherein the portion of the metal wire is fixedly attached to the corresponding portion of the first elastic substrate at the adhesion joint using stitching.

6. The stretchable metal wire assembly of claim 1 wherein the first elastic substrate is fixedly attached to the second elastic substrate proximate the first perimeter edges and the first elastic substrate is fixedly attached to the second elastic substrate proximate the second perimeter edges using an adhesive material.

7. The stretchable metal wire assembly of claim 1 wherein the first elastic substrate is fixedly attached to the second elastic substrate proximate the first perimeter edges and the first elastic substrate is fixedly attached to the second elastic substrate proximate the second perimeter edges using stitching.

8. The stretchable metal wire assembly of claim 1 wherein the first elastic substrate is fixedly attached to the second elastic substrate along the select one or more cross-sections using an adhesive material.

9. The stretchable metal wire assembly of claim 1 wherein the first elastic substrate is fixedly attached to the second elastic substrate along the select one or more cross-sections using stitching.

10. The stretchable metal wire assembly of claim 1 further comprising one or more additional metal wires positioned adjacent to the metal wire and electrically isolated from each other, where each additional metal wire forms the tortuous path.

11. The stretchable metal wire assembly of claim 1 wherein the first elastic substrate and the second elastic substrate comprise one or more of an elastomer, silicone, urethane, latex and elastane.

12. The stretchable metal wire assembly of claim 1 wherein the metal wire comprises one or more of gold, silver, copper, nickel and their alloys.

13. The stretchable metal wire assembly of claim 1 wherein the metal wire comprises a magnet wire.

* * * * *